United States Patent
Nishikawa et al.

(10) Patent No.: US 7,408,435 B2
(45) Date of Patent: Aug. 5, 2008

(54) COIL COMPONENT

(75) Inventors: Tomonaga Nishikawa, Tokyo (JP); Tomokazu Ito, Tokyo (JP); Makoto Yoshida, Tokyo (JP); Hiroshi Kamiyama, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/907,603

(22) Filed: Oct. 15, 2007

(65) Prior Publication Data
US 2008/0100409 A1 May 1, 2008

(30) Foreign Application Priority Data
Nov. 1, 2006 (JP) ............... 2006-297805

(51) Int. Cl.
*H01F 5/00* (2006.01)

(52) U.S. Cl. .............. 336/200; 336/223; 336/232

(58) Field of Classification Search ........ 336/200, 336/223, 232
See application file for complete search history.

(56) References Cited

U.S. PATENT DOCUMENTS

| | | | |
|---|---|---|---|
| 5,250,923 A * | 10/1993 | Ushiro et al. | 336/83 |
| 6,181,232 B1 * | 1/2001 | Kitamura | 336/200 |
| 6,710,694 B2 * | 3/2004 | Matsuta et al. | 336/200 |
| 6,768,410 B1 * | 7/2004 | Yazaki et al. | 336/200 |
| 6,903,643 B2 * | 6/2005 | Lee et al. | 336/200 |
| 7,064,629 B2 | 6/2006 | Shoji | |
| 2005/0181684 A1 * | 8/2005 | Ito et al. | 439/894 |
| 2005/0253677 A1 * | 11/2005 | Ito et al. | 336/200 |

FOREIGN PATENT DOCUMENTS

| | | |
|---|---|---|
| JP | A 08-203737 | 8/1996 |
| JP | B2 3601619 | 10/2004 |
| JP | A 2005-159223 | 6/2005 |

* cited by examiner

*Primary Examiner*—Anh T Mai
(74) *Attorney, Agent, or Firm*—Oliff & Berridge, PLC

(57) ABSTRACT

The invention relates to surface-mount type coil components having a mounting surface for mounting them on a printed circuit board or hybrid IC (HIC) and provides a low-cost coil component having a low direct-current resistance. A common mode filter includes a bridge conductor layer which has a bridge conductor one end of which is connected to one end of a lead wire and another end of which is connected to an inner circumferential end of a coil conductor and another bridge conductor one end of which is connected to one end of another lead wire and another end of which is connected to an inner circumferential end of another coil conductor, the bridge conductor layer being formed between two coil conductor layers with an insulation film interposed between the bridge conductor layer and each of the coil conductor layers.

3 Claims, 5 Drawing Sheets

COIL COMPONENT

BACKGROUND OF THE INVENTION

1. Field of the Invention

The present invention relates to a surface-mount type coil component having a mount surface for mounting the same on a printed circuit board or a hybrid IC (HIC).

2. Description of the Related Art

Known coil components mounted on circuits in electronic apparatus such as personal computers and cellular phones include wire-wound type components provided by winding a copper wire around a ferrite core, multi-layer type components provided by forming a coil conductor pattern on a surface of a magnetic sheet made of ferrite and stacking such magnetic sheets one over another, and thin-film type components provided by forming insulation films and coil conductors constituted by metal thin films alternately using thin film forming techniques. Multi-layer type and thin-film type coil components can be easily provided with a small size.

Known coil components include common mode filters for suppressing a common mode current which can cause electromagnetic interference in a balanced transmission system. Patent Document 1 discloses a common mode choke coil (common mode filter) provided by stacking a first insulator layer, two lead-out electrodes, a second insulator layer, a first coil conductor, a third insulator layer, a second coil conductor, and a fourth insulator layer in the order listed on a surface of a magnetic substrate. One of the two lead-out electrodes is electrically connected to the first coil conductor through a via hole provided on the second insulator layer, and the other electrode is electrically connected to the second coil conductor through via holes provided on the second and third insulator layers.

To decrease the direct-current resistance of the common mode filter and to improve electrical characteristics of the same such as impedance characteristics and transmission characteristics in a differential mode, the coil conductors of the filter must be formed with a great width. However, when the coil conductors are formed with a greater width, a greater electrostatic capacity (floating capacity) will be generated between the two coil conductors. In a differential mode, an electrostatic capacity is a parasite in parallel with the inductance of a coil conductor. Therefore, when a relatively great electrostatic capacity is generated at the common mode filter, the electrostatic capacity constitutes the dominant impedance of the filter in high frequency bands.

In order to suppress any increase in the electrostatic capacity while forming the coil conductors with a greater width, the distance between the two coil conductors must be made greater (e.g., 20 μm or more). The thickness of the insulator layer between the two coil conductors must be increased to increase the distance between the two coil conductors. When the thickness of the insulator layer between the two coil conductors of the common mode filter disclosed in Patent Document 1 is increased, the insulator layer between the two coil conductors must be formed with a thickness greater than that of the insulator layer between the lead-out electrodes and the first coil conductor.

In order to provide the insulator layer between the two coil conductors with a great thickness, for example, the insulator layer must be provided by performing a plurality of forming steps consecutively. When the insulator layer is formed by performing a plurality of steps consecutively, the number of manufacturing steps increases, which results in an increase in manufacturing time. In order to form the insulator layer between the two coil conductors at a time, for example, it is necessary to form the insulator layer between the two coil conductors from a material different from the material of the insulator layer between the lead-out electrodes and the first coil conductor. When the two insulator layers are formed from different materials, for example, different apparatus must be used to form the insulator layer between the two coil conductors and the insulator layer between the lead-out electrodes and the first coil conductor. A problem therefore arises in that an increase in the distance between the two coil conductors results in an increase in the manufacturing cost of the common mode filter.

Patent Document 2 discloses a thin-film common mode filter provided by stacking a first insulator layer, a lower lead conductor, a second insulator layer, a lower coil conductor, a third insulator layer, an upper coil conductor, a fourth insulator layer, an upper lead conductor, and a fifth insulator layer in the order listed, on an insulated magnetic substrate. The above-described problem occurs also in the thin-film common mode filter disclosed in Patent Document 2.

There is demand for further reduction in the direct-current resistance of common mode filters. Direct-current resistance is the dominant common mode impedance in low frequency bands. It is desirable for common mode filters to have low common mode impedance in low frequency bands. Further, there is demand for reduction in power consumption in products such as cellular phones. A common mode filter having a low direct-current resistance allows a reduction in the power consumption of an electronic apparatus employing the common mode filter. It is therefore desirable for a common mode filter to have a low direct-current resistance.

Patent Document 1: Japanese Patent No. 3601619

Patent Document 2: JP-A-2005-159223

SUMMARY OF THE INVENTION

It is an object of the invention to provide a low-cost coil component having a low direct-current resistance.

(1) The above-described object is achieved by a coil component characterized in that it includes:

a first coil conductor layer having first and second electrode terminals, a first lead-out conductor one end of which is connected to the first electrode terminal, and a first coil conductor connected to the second electrode terminal at an outer circumferential end thereof;

a second coil conductor layer having third and fourth electrode terminals, a second lead-out conductor one end of which is connected to the third electrode terminal, and a second coil conductor connected to the fourth electrode terminal at an outer circumferential end thereof, the second coil conductor layer being disposed opposite to the first coil conductor layer; and a bridge conductor layer having a first bridge conductor one end of which is connected to another end of the first lead-out conductor and another end of which is connected to an inner circumferential end of the first coil conductor and a second bridge conductor one end of which is connected to another end of the second lead-out conductor and another end of which is connected to an inner circumferential end of the second coil conductor, the bridge conductor layer being formed between the first and second coil conductor layers with insulation films disposed between the bridge conductor layer and the first and second coil conductor layers.

(2) The invention provides a coil component according to the item (1), characterized in that a thickness of the first and second lead-out conductors is greater than a thickness of the first and second bridge conductors.

(3) The invention provides a coil component according to the item (1), characterized in that the first and second bridge conductors are not exposed on side surfaces of the insulation films.

The invention makes it possible to provide a low-cost coil component having a low direct-current resistance.

DESCRIPTION OF THE PREFERRED EMBODIMENTS

Figure 1:
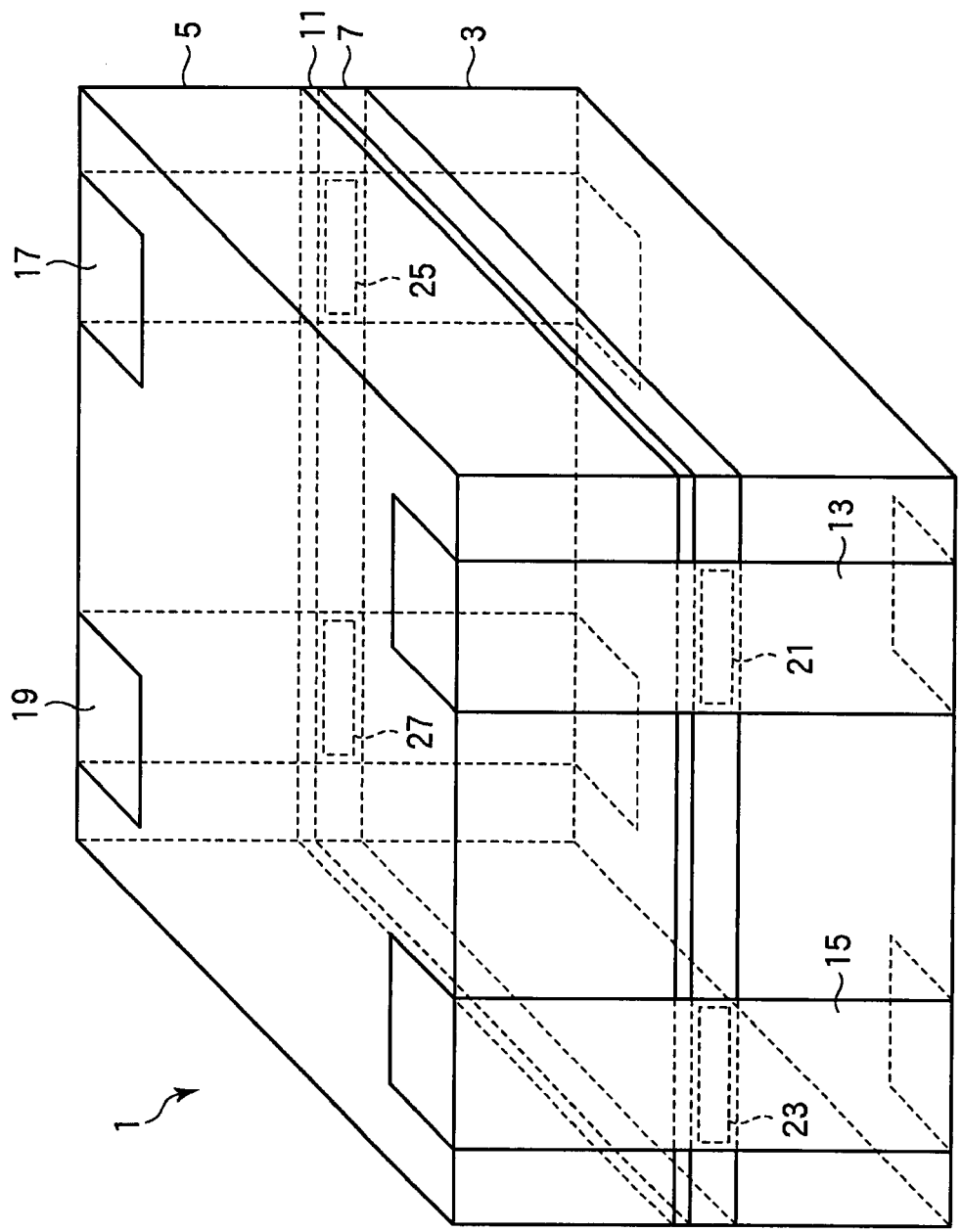
FIG. 1 is a perspective view of a common mode filter 1 according to an embodiment of the invention.

A coil component according to an embodiment of the invention will now be described with reference to FIGS. 1 to 6. A common mode filter for suppressing a common mode current which can cause electrostatic interference in a balanced transmission system will be described as an example of a coil component of the present embodiment. FIG. 1 is a perspective view of a common mode filter 1. In FIG. 1, hidden lines are indicated by broken lines.

As shown in FIG. 1, the common mode filter 1 has a rectangular parallelepiped outline which is formed by stacking thin films between two magnetic substrates 3 and 5 in the form of thin rectangular parallelepiped plates disposed to face each other. An insulation layer 7 and a bonding layer 11 are formed in the order listed between the magnetic substrates 3 and 5 using thin-film forming techniques. Internal electrode terminals 21, 23, 25, and 27 are formed in the vicinity of side surfaces of the insulation layer 7 such that they are exposed on the side surfaces of the insulation layer 7. The internal electrode terminals 21 and 23 are exposed on one side surface, and the internal electrode terminals 25 and 27 are exposed on the side surface opposite to that side surface. The internal electrode terminal 21 is disposed opposite to the internal electrode terminal 25, and the internal electrode terminal 23 is disposed opposite to the internal electrode terminal 27.

Figure 2:
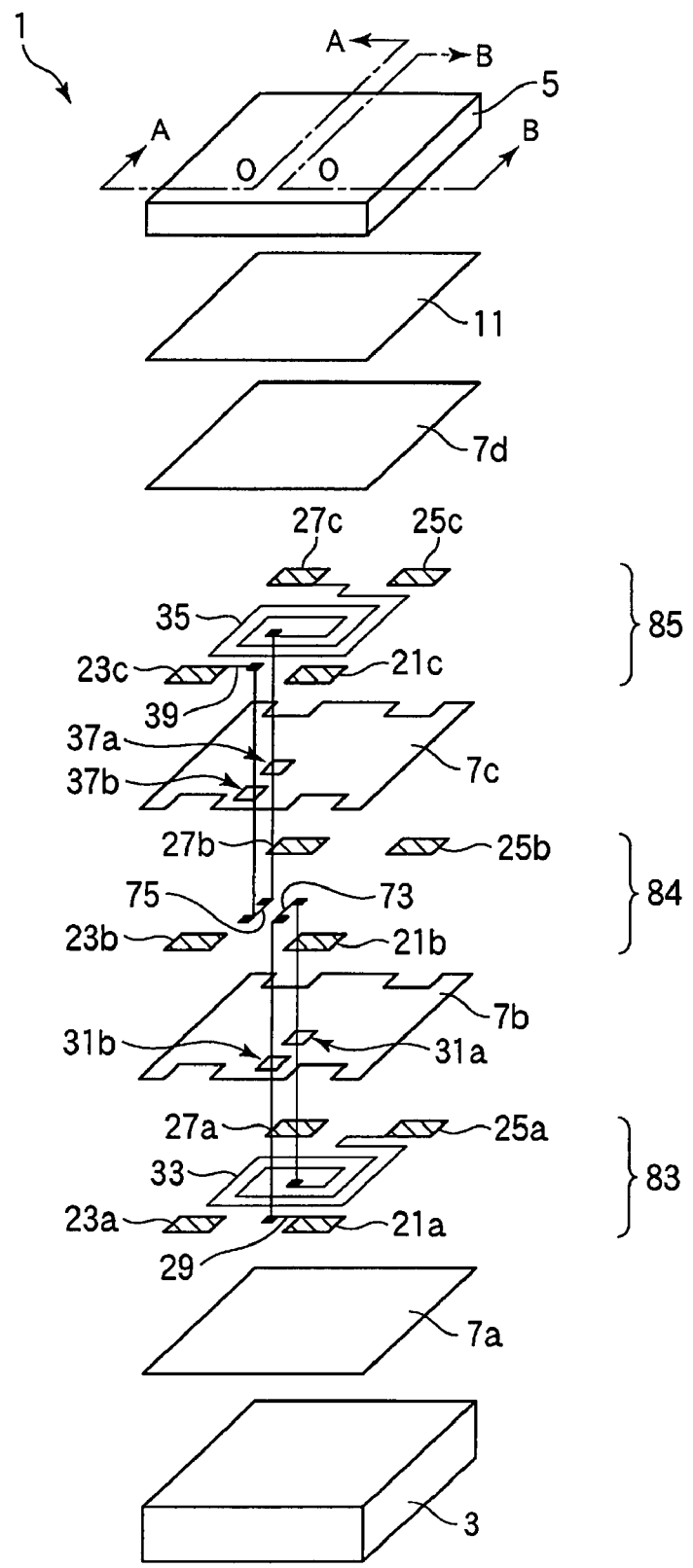
FIG. 2 is an exploded perspective view of the common mode filter 1 according to the embodiment of the invention.

An external electrode 13 is formed to extend on the side surface where the internal electrode terminal 21 is exposed and on mounting surfaces of the magnetic substrates 3 and 5. External electrodes 15, 17, and 19 are formed in the same shape as the external electrode 13. The external electrodes 13, 15, 17, and 19 are electrically connected to the internal electrode terminals 21, 23, 25, and 27 exposed on the side surfaces, respectively, FIG. 2 is an exploded perspective view of the common mode filter 1 showing a multi-layer structure of the same. FIG. 2 omits the external electrodes 13, 15, 17, and 19. As shown in FIG. 2, an insulation film 7a, a coil conductor layer (first coil conductor layer) 83, an insulation film 7b, a bridge conductor layer 84, an insulation film 7c, a coil conductor layer (second coil conductor layer) 85, an insulation film 7d, and a bonding layer 11 are stacked in the order listed between the magnetic substrates 3 and 5. The insulation layer 7 is constituted by the insulation films 7a, 7b, 7c, and 7d. The coil conductor layer 85 is disposed opposite to the coil conductor layer 83 with the insulation film 7b, the bridge conductor layer 84, and the insulation film 7c interposed between the coil conductor layers. The bridge conductor layer 84 is disposed between the coil conductor layers 83 and 85 with the insulation film 7b interposed between the conductor layers 84 and 83 and the insulation film 7c interposed between the conductor layers 84 and 85.

The coil conductor layer 83 includes internal electrode terminals 21a, 23a, 25a, and 27a, a lead wire (first lead-out conductor) 29, and a coil conductor (first coil conductor) 33. One end of the lead wire 29 is connected to the internal electrode terminal (first electrode terminal) 21a. The coil conductor 33 is formed in a spiral shape. An outer circumferential end of the coil conductor 33 is connected to the internal electrode terminal (second electrode terminal) 25a. Another end of the lead wire 29 is exposed at a through hole 31b formed in the insulation film 7b. An inner circumferential end of the coil conductor 33 is exposed at a through hole 31a formed in the insulation film 7b.

The bridge conductor layer 84 includes internal electrode terminals 21b, 23b, 25b, and 27b, a bridge conductor (first bridge conductor) 73, and a bridge conductor (second bridge conductor) 75. One end of the bridge conductor 73 is connected to the other end of the lead wire 29 exposed at the through hole 31b. Another end of the bridge conductor 73 is connected to the inner circumferential end of the coil conductor 33 exposed at the through hole 31a. The bridge conductor 73 extends across the coil conductor 33 with the insulation film 7b interposed when viewed in the normal direction of a substrate surface. Therefore, the coil conductor 33 is electrically connected to the internal electrode terminal 21a formed in the coil conductor layer 83 in which the conductor resides through the bridge conductor 73 formed in the bridge conductor layer 84 and through the lead wire 29 which also resides in the same layer as the coil conductor 33. Two ends of the bridge conductor 75 are exposed at through holes 37a and 37b formed in the insulation film 7c, respectively. The lead wire 29 and the bridge conductor 73 are not exposed on side surfaces of the insulation layer 7 (insulation films 7a, 7b, 7c, and 7d).

The coil conductor layer 85 includes internal electrode terminals 21c, 23c, 25c, and 27c, a lead wire (second lead-out conductor) 39, and a coil conductor (second coil conductor) 35. One end of the lead wire 39 is connected to the internal electrode terminal (third electrode terminal) 23c. The coil conductor 35 is formed in a spiral shape which is substantially similar to the shape of the coil conductor 33, and it faces the coil conductor 33 so as to sandwich the insulation film 7b, the bridge conductor layer 84, and the insulation film 7c. An outer circumferential end of the coil conductor 35 is connected to the internal electrode terminal (fourth electrode terminal) 27c.

Another end of the lead wire 39 is connected to one end of the bridge conductor 75 through the through hole 37b. An inner circumferential end of the coil conductor 35 is connected to another end of the bridge conductor 75 through the through hole 37a. The bridge conductor 75 extends across the coil conductor 35 with the insulation film 7c interposed when viewed in the normal direction of the substrate surface. Therefore, the coil conductor 35 is electrically connected to the internal electrode terminal 23c formed in the coil conductor layer 85 in which the conductor resides through the bridge conductor 75 formed in the bridge conductor layer 84 and through the lead wire 39 which also resides in the same layer as the coil conductor 35. The lead wire 39 and the bridge conductor 75 are not exposed on the side surfaces of the insulation layer 7 (insulation films 7a, 7b, 7c, and 7d).

The internal electrode terminal 21 shown in FIG. 1 is formed by stacking the internal electrode terminals 21a, 21b, and 21c in the order listed. The internal electrode terminal 23 is formed by stacking the internal electrode terminals 23a, 23b, and 23c in the order listed. The internal electrode terminal 25 is formed by stacking the internal electrode terminals 25a, 25b, and 25c in the order listed. The internal electrode terminal 27 is formed by stacking the internal electrode terminals 27a, 27b, and 27c in the order listed.

The coil conductors 33 and 35, the lead wires 29 and 39, and the bridge conductors 73 and 75 are embedded in the insulation layer 7 to form one choke coil. The external electrode 13 shown in FIG. 1 is electrically connected to the external electrode 17 through the internal electrode terminal 21, the lead wire 29, the bridge conductor 73, the coil conductor 33, and the internal electrode terminal 25. The external electrode 15 is electrically connected to the external electrode 19 through the internal electrode terminal 23, the lead wire 39, the bridge conductor 75, the coil conductor 35, and the internal electrode terminal 27.

The magnetic substrates 3 and 5 are formed from a magnetic material such as sintered ferrite or composite ferrite. Each of the insulation films 7a, 7b, 7c, and 7d is formed by applying a material having high insulating properties and high workability such as polyimide resin or epoxy resin and patterning the same into a predetermined shape. The coil conductors 33 and 35, the bridge conductors 73 and 75, the lead wires 29 and 39, and the internal electrode terminals 21, 23, 25, and 27 are provided by forming films of Cu, silver (Ag), or aluminum (Al) which have high electrical conductivity and workability and patterning the films into predetermined shapes. The insulation films 7a, 7b, 7c, and 7d and the bridge conductor layer 84 have a thickness, for example, in the range from 7 to 8 µm. Therefore, the distance between the coil conductors 33 and 35 is, for example, in the range from 21 to 24 µm. The coil conductor layers 83 and 85 have a thickness, for example, in the range from 18 to 20 µm.

To improve the degree of mutual magnetic coupling between the coil conductor 33 and the coil conductor 35 and to improve impedance characteristics by increasing common mode impedance, the insulation layer 7 may be removed in regions of the coil conductors 33 and 35 on the inner circumferential side thereof to form openings, and magnetic layers may be formed so as to fill the openings. For the same purpose, four parts of the insulation layer 7 at the corners thereof may be removed to form openings in those parts respectively, and magnetic layers may be formed so as to fill the openings. For example, the magnetic layers may be formed from composite ferrite obtained by mixing magnetic particles made of ferrite in a resin.

Figure 3:
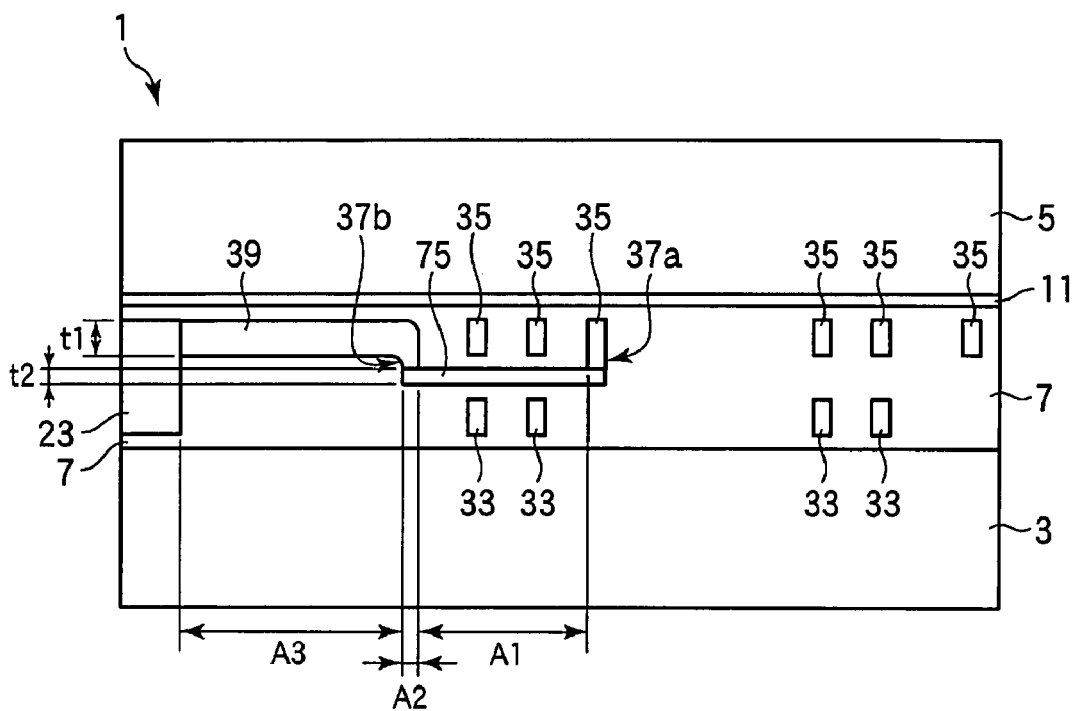
FIG. 3 is a sectional view (section 1) of the common mode filter 1 according to the embodiment of the invention.
Figure 4:
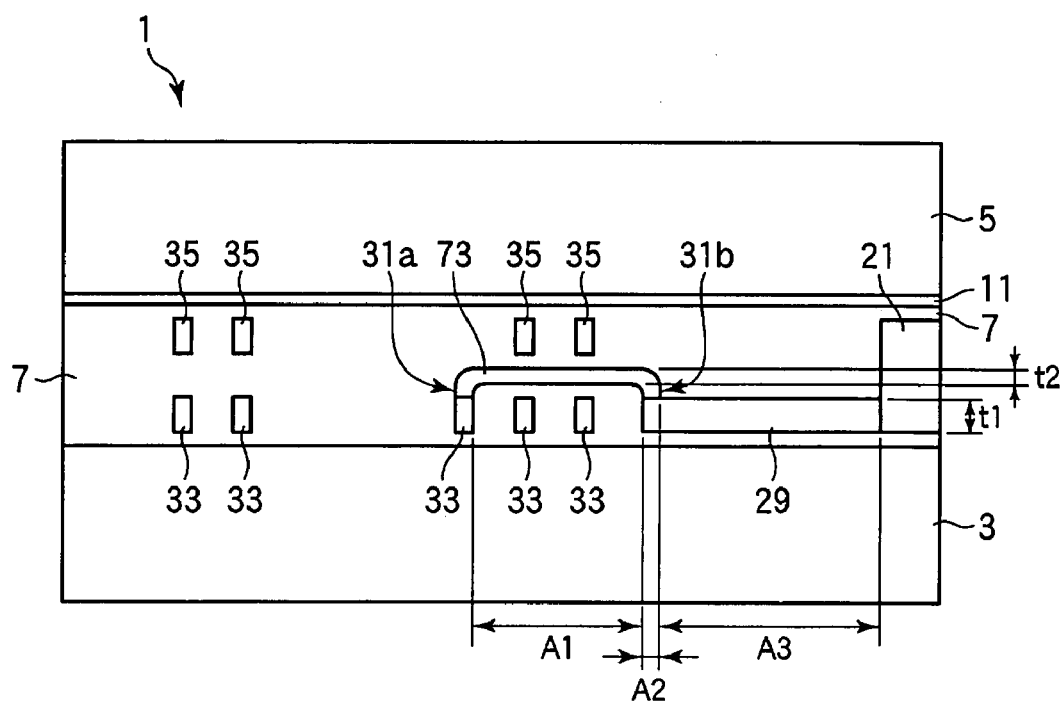
FIG. 4 is a sectional view (section 2) of the common mode filter 1 according to the embodiment of the invention.

FIG. 3 is a sectional view taken along an imaginary line A-O-A which is formed by an imaginary straight line extending through the internal electrode terminal 23 constituted by the internal electrode terminals 23a, 23b, and 23c and through the lead wire 39 and an imaginary straight line extending perpendicularly to that straight line through the bridge conductor 75 (see FIG. 2). FIG. 4 shows a section taken along an imaginary line B-O-B which is formed by an imaginary straight line extending through the bridge conductor 73 and an imaginary straight line extending perpendicularly to that straight line through the internal electrode terminal 21 constituted by the internal electrode terminals 21a, 21b, and 21c and through the lead wire 29 (see FIG. 2).

As shown in FIG. 3, the conductor connecting the inner circumferential end of the coil conductor 35 and the internal electrode terminal 23 is constituted by the lead wire 39 and the bridge conductor 75. The conductor is shown as having three divisions of regions A1, A2, and A3. The region A1 is a region of the bridge conductor 75 excluding parts thereof where the conductor is connected to the coil conductor 35 and the lead wire 39, respectively. The region A2 is a region where the lead wire 39 and the bridge conductor 75 are connected to each other. The region A3 is a region of the lead wire 39 excluding a part thereof where the wire is connected to the bridge conductor 75. The lead wire 39 has a thickness t1. The bridge conductor 75 has a thickness t2. Therefore, the conductor has the thickness t2 in the region A1 and has the thickness t1 in the region A3. The thickness of the conductor in the region A2 is substantially equal to the sum of the thickness t1 of the lead wire 39 and the thickness t2 of the bridge conductor 75 (t1+t2). The thickness of the coil conductor 35 is substantially the same as the thickness t1 of the lead wire 39. The thickness t1 of the lead wire 39 is greater than the thickness t2 of the bridge conductor 75.

As shown in FIG. 4, the conductor connecting the inner circumferential end of the coil conductor 33 and the internal electrode terminal 21 is constituted by the lead wire 29 and the bridge conductor 73. The conductor is shown as having three divisions of regions A1, A2, and A3. The region A1 is a region of the bridge conductor 73 excluding parts thereof where the conductor is connected to the coil conductor 33 and the lead wire 29, respectively. The region A2 is a region where the lead wire 29 and the bridge conductor 73 are connected to each other. The region A3 is a region of the lead wire 29 excluding a part thereof where the wire is connected to the bridge conductor 73. The lead wire 29 has a thickness equal to the thickness t1 of the lead wire 39. The bridge conductor 73 has a thickness equal to the thickness t2 of the bridge conductor 75. Therefore, the conductor has the thickness t2 in the region A1 and has the thickness t1 in the region A3. The thickness of the conductor in the region A2 is substantially equal to the sum of the thickness t1 of the lead wire 29 and the thickness t2 of the bridge conductor 73 (t1+t2). The thickness of the coil conductor 33 is substantially the same as the thickness t1 of the lead wire 29. The thickness t1 of the lead wire 29 is greater than the thickness t2 of the bridge conductor 73.

Figure 5:
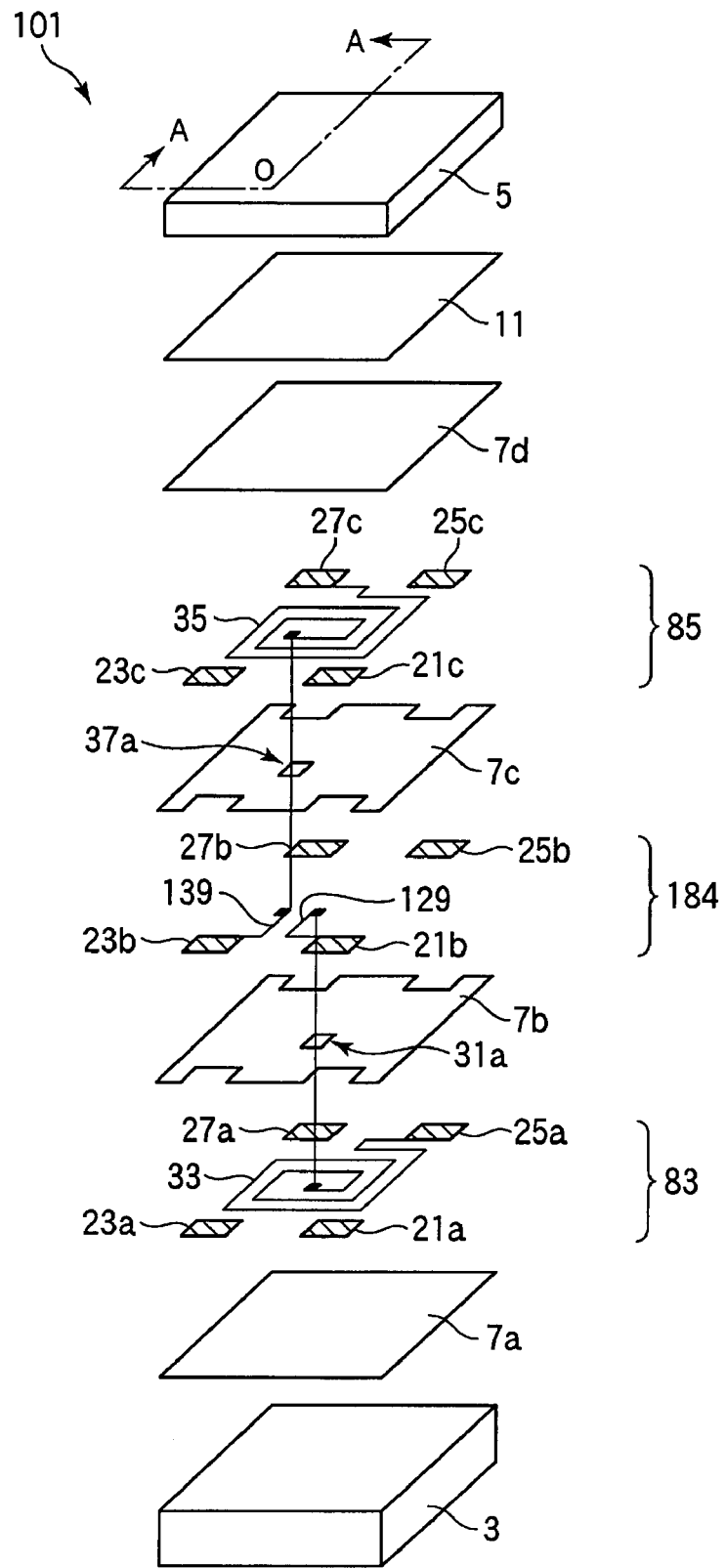
FIG. 5 is an exploded perspective view of a common mode filter 101 which is an example to be compared with the embodiment of the invention.
Figure 6:
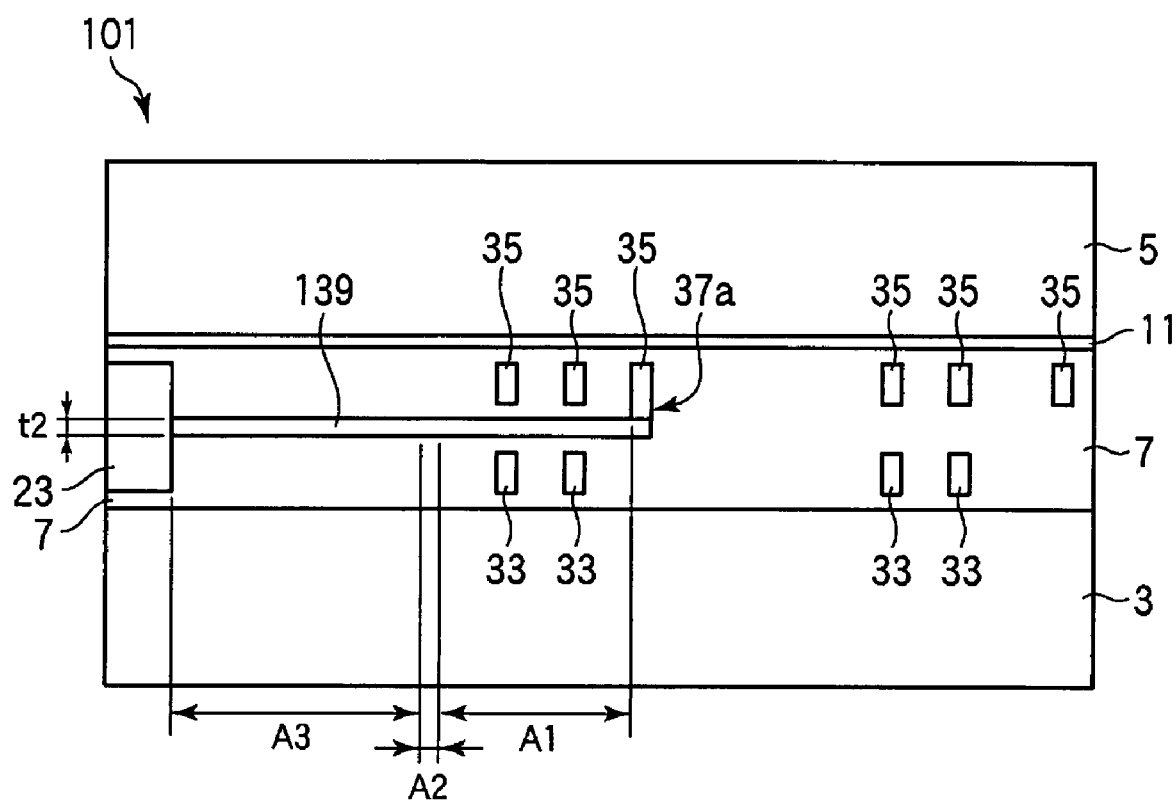
FIG. 6 is a sectional view of the common mode filter 101 which is an example to be compared with the embodiment of the invention.

FIG. 5 is an exploded perspective view of a multi-layer structure of a common mode filter 101 according to the related art shown as an example to be compared with the common mode filter 1 of the present embodiment. In FIGS. 5 and 6, elements having the same functions and effects as the elements shown in FIGS. 1 to 4 are indicated by like reference numerals and will not be described in detail.

As shown in FIG. 5, an insulation film 7a, a coil conductor layer 83, an insulation film 7b, a lead wire layer 184, an insulation film 7c, a coil conductor layer 85, an insulation film 7d, and a bonding layer 11 are stacked in the order listed between magnetic substrates 3 and 5. The lead wire layer 184 includes internal electrode terminals 21b, 23b, 25b, and 27b and lead wires 129 and 139. In the common mode filter 101, the lead wire 129 is formed instead of the lead wire 29 and the bridge conductor 73 of the common mode filter 1, and the lead wire 139 is formed instead of the lead wire 39 and the bridge conductor 75.

The lead wire 129 is formed such that it has an L-like shape when viewed in the normal direction of a surface of the substrate. One end of the lead wire 129 is connected to the internal electrode terminal 21b. Another end of the lead wire 129 is connected to an inner circumferential end of a coil conductor 33 exposed at a through hole 31a. The lead wire 129 extends across the coil conductor 33 with the insulation film 7b interposed between them when viewed in the normal direction of the substrate surface. Thus, the coil conductor 33 is electrically connected to the internal electrode terminal 21b, which is in a different layer, through the lead wire 129 formed on the lead wire layer 184.

The lead wire 139 is formed such that it has a shape like an inverted L when viewed in the normal direction of the substrate surface. One end of the lead wire 139 is connected to the internal electrode terminal 23b. Another end of the lead wire 139 is exposed at a through hole 37a and connected to an inner circumferential end of a coil conductor 35 through the through hole 37a. The lead wire 139 extends across the coil conductor 35 with the insulation film 7c interposed between them when viewed in the normal direction of the substrate surface. Thus, the coil conductor 35 is electrically connected to the internal electrode terminal 23b, which is in a different layer, through the lead wire 139 formed on the lead wire layer 184.

FIG. 6 is a sectional view taken along an imaginary line A-O-A extending along an internal electrode terminal 23 constituted by internal electrode terminals 23a, 23b, and 23c and the lead wire 139 (see FIG. 5). FIG. 6 shows only the lead wire 139 of the couple of lead wires 129 and 139 having substantially the same shape, and the following description on the shape of the lead wire 139 equally applies to the lead wire 129.

As shown in FIG. 6, the conductor connecting the inner circumferential end of the coil conductor 35 and the internal electrode terminal 23 is entirely constituted by the lead wire 139. The conductor has three divisions of regions A1, A2, and A3. The region A2 is a region of the lead wire 139 where the lead wire 139 is bent, and this region corresponds to the region A2 shown in FIG. 3. The region A1 is a region of the lead wire 139 extending from a region of the lead wire connected to the coil conductor 35 up to the bent region, and this region corresponds to the region A1 shown in FIG. 3. The region A3 is a region of the lead wire 139 extending from the bent region up to the internal electrode terminal 23, and this region corresponds to the region A3 shown in FIG. 3.

The lead wire 139 has a thickness t2 equal to the thickness of the bridge conductors 73 and 75. Therefore, the conductor has the thickness t2 in all of the regions A1, A2, and A3. For example, the lead wire 139 has a width which is equal to the width of the lead wires 29 and 39 and the bridge conductors 73 and 75. The lengths and widths of the conductor in the regions A1, A2, and A3 shown in FIG. 6 are the same as the lengths and widths of the conductor in the regions A1, A2, and A3 shown in FIG. 3, respectively.

In order to compare direct-current resistances of transmission paths of the common mode filters 1 and 101, the inventors carried out a simulation to analyze the direct-current resistance of the transmission paths of each of the common mode filters 1 and 101. The common mode filters 1 and 101 have two transmission paths, i.e., a transmission path including the coil conductor 33 and a transmission path including the coil conductor 35, and the simulation and analysis was carried out on the direct-current resistance of the transmission path including the coil conductor 35. As shown in FIGS. 1 and 2, in the common mode filter 1, the transmission path including the coil conductor 35 is constituted by the internal electrode terminal 23, the lead wire 39, the bridge conductor 75, the coil conductor 35, and the internal electrode terminal 27. As shown in FIG. 5, in the common mode filter 101, the transmission path including the coil conductor 35 is constituted by the internal electrode terminal 23, the lead wire 139, the coil conductor 35, and the internal electrode terminal 27. The direct-current resistance of the transmission path including the coil conductor 33 is substantially equal to the direct-current resistance of the transmission path including the coil conductor 35.

Design values used for the simulation and analysis were as follows. The lead wires 39 and 139 and the bridge conductor 75 had a width w of 16 μm. The thickness t1 of the lead wire 39 was 18 μm. The thickness t2 of the bridge conductor 75 and the lead wire 139 was 7 μm. The conductor had a length L1 of 250 μm in the region A1. The conductor had a length L2 of 40 μm in the region A2. The conductor had a length L3 of 224 μm in the region A3. The lead wire 39 and 139 and the bridge conductor 75 had an electrical resistivity ρ of $1.67 \times 10^{-8}$ (Ω·m). The direct-current resistance of the transmission paths excluding the regions A1, A2, and A3 was 0.42(Ω).

TABLE 1

| Region | Length(μm) | Thickness (μm) | |
| --- | --- | --- | --- |
| | | Filter 101 | Filter 1 |
| A1 | 250 | 7 | 7 |
| A2 | 40 | 7 | 18 + 7 |
| A3 | 224 | 7 | 18 |
| DC Resistance (Ω) in A1, A2, A3 | | $7.66 \times 10^{-2}$ | $5.19 \times 10^{-2}$ |
| DC Resistance (Ω) of Transmission Path excluding A1, A2, A3 | | 0.42 | 0.42 |
| DC Resistance (Ω) of Transmission Path | | $4.97 \times 10^{-1}$ | $4.72 \times 10^{-1}$ |

Table 1 shows results of the simulation and analysis of direct-current resistances in the form of a comparison between the common mode filter 101 and the common mode filter 1. Let us assume that the length, width, and thickness of a conductor in a region Ak (k=1, 2, 3) are represented by Lk, wk, and t'k, respectively. Then, the region Ak has a direct-current resistance Rk which is given by $Rk=\rho(Lk/(wk \cdot t'k))$. Since conductors in the regions A1, A2, and A3 are connected in series, a conductor connecting the inner circumferential end of the coil conductor 35 and the internal electrode terminal 23 has a direct-current resistance R which is given by R=R1+R2+R3.

As shown in Table 1, in the case of the common mode filter 101, the thickness t'k of the conductor connecting the inner circumferential end of the coil conductor 35 and the inner electrode terminal 23 is t2 (=7 μm) in all of the regions A1, A2, and A3. The direct-current resistance R of the conductor (i.e., the direct-current resistance in the regions A1, A2, and A3) is $7.66 \times 10^{-2}$(Ω).

In the case of the common mode filter 1, the thickness t'k of the conductor connecting the inner circumferential end of the coil conductor 35 and the internal electrode terminal 23 is t2 (=7 μm) in the region A1, t1+t2 (=18+7 μm) in the region A2, and t1 (=18 μm) in the region A3. The direct-current resistance R of the conductor (i.e., the direct-current resistance in the regions A1, A2, and A3) is $5.19 \times 10^{-2}$(Ω).

Therefore, the direct-current resistance R of the conductor connecting the inner circumferential end of the coil conductor 35 and the internal electrode terminal 23 of the common mode filter 1 is 32.2% smaller than that in the common mode filter 101. The direct-current resistance of a transmission path is given as the sum of the direct-current resistance of the path in the regions A1, A2, and A3 and the direct-current resistance of the transmission path excluding the regions A1, A2, and A3. The transmission paths in the common mode filter 1 and the common mode filter 101 have the same direct-current resistance that is 0.42 (Q) when the regions A1, A2, and A3 are excluded. Therefore, the direct-current resistance of the transmission path in the common mode filter 101 is $4.97 \times 10^{-1}$(Ω). The direct-current resistance of the transmission path in the common mode filter 1 is $4.72 \times 10^{-1}$(Ω). Therefore, the direct-current resistance of the transmission path in the common mode filter 1 is 5.0% smaller than that in the common mode filter 101.

The direct-current resistance of the transmission path in the common mode filter 101 may be decreased by increasing the thickness of the lead wires 129 and 139. In order to increase the thickness of the lead wires 129 and 139, the lead wire layer 184 must be formed with a greater thickness. However, when the thickness of the lead wire layer 184 is increased to decrease the direct-current resistance, the flatness of the pattern of the coil conductor 35 located above the layer can be affected. As a result, significant variation can partially occur in the distance between the coil conductors 33 and 35, which can adversely affect signal transmission. When the insulation films 7b and 7c are formed with a small thickness, shorting can occur between the coil conductor 33 and the lead wires 129 and 139 and between the coil conductor 35 and the lead wires 129 and 139, and the reliability of the common mode filter 101 can be consequently reduced. Therefore, in order to obtain a common mode filter 101 having desired electrical characteristics, the distance between the two coil conductors 33 and 35 and the thickness of the insulation layers 7b and 7c must be kept at predetermined values.

As described above, in the common mode filter 1 of the present embodiment, the conductor connecting the inner circumferential end of the coil conductor 33 and the internal electrode terminal 21 is constituted by the lead wire 29 formed in the coil conductor layer 83 in which the conductor resides and the bridge conductor 73 formed in the bridge conductor layer 84. Similarly, the conductor connecting the inner circumferential end of the coil conductor 35 and the internal electrode terminal 23 is constituted by the lead wire 39 formed in the coil conductor layer 85 in which the conductor resides and the bridge conductor 75 formed in the bridge conductor layer 84. The thickness t1 of the lead wires 29 and 39 is equal to the thickness of the coil conductors 33 and 35. The thickness t1 of the lead wires 29 and 39 is greater than the thickness t2 of the bridge conductors 73 and 75. Therefore, the direct-current resistance of the common mode filter 1 of the present embodiment can be smaller than that of the common mode filter 101 in which the conductors connecting the inner circumferential ends of the coil conductors and the internal electrode terminals are entirely formed in a layer (lead wire layer 184) that is different from the layers in which the coil conductors reside. Therefore, the present embodiment makes it possible to provide a common mode filter 1 having a low direct-current resistance.

A description will now be made using FIG. 2 on a method of manufacturing a coil component according to the present embodiment with reference to the common mode filter 1 by way of example. A multiplicity of common mode filters 1 are simultaneously formed on a wafer, but FIG. 2 shows an exploded perspective view of a single common mode filter 1 to show the multi-layer structure of the same.

First, as shown in FIG. 2, polyimide resin is applied to the top of a magnetic substrate 3 to form an insulation film 7a having a thickness in the range from 7 to 8 μm. The insulation film 7a is formed using a spin coat process, a dipping process, a spray process, or a printing process. Then, the insulation film 7a is cured. Each of insulation films 7b, 7c, and 7d to be described later is formed using a similar process.

Next, a metal layer such as a Cu layer (not shown) is formed throughout the resultant surface using a vacuum film forming process (such as evaporation or sputtering) or a plating process. Although what is required for the electrode film is that it is formed from a conductive material, it is desirable to use the same material as the material for forming plating films to be described later. A bonding layer such as a Cr (chromium) film or Ti (titanium) film may be formed under the electrode film, the bonding layer serving as a buffer film for improving adhesion between the insulation film 7a and the electrode film.

Next, a resist is applied throughout the resultant surface to form a resist layer, and a pre-baking process is performed on the resist layer as occasion demands. Exposure is then carried out on the resist layer by irradiating the resist layer with exposure light through a mask having patterns drawn thereon representing internal electrode terminals 21a, 23a, 25a, and 27a, a lead wire 29, and a coil conductor 33. After performing a heating process as occasion demands, the resist layer is developed using an alkaline developer. For example, Tetra-Methyl-Ammonium-Hydroxide (TMAH) having a predetermined concentration may be used as the alkaline developer.

The process then proceeds from the developing step to a cleaning step. The developer in the resist layer is cleaned away with a cleaning liquid to stop the developing and dissolving reactions of the resist layer. As a result, the resist layer is patterned in a predetermined shape to form a resist frame. For example, pure water is used as the cleaning liquid. When the cleaning is completed, the substrate is dried by shaking the same to remove the cleaning liquid. If necessary, the magnetic substrate 3 may be heated such that the cleaning liquid will dry up.

Next, the magnetic substrate 3 is immersed in a plating liquid in a plating bath to perform a plating process using the resist frame as a die, and plating films of Cu are thereby formed in gaps of the resist frame. The magnetic substrate 3 is then washed and dried as occasion demands, and the resist frame is removed from the insulation film 7a using an organic solvent. Then, dry etching (such as ion milling or reactive ion etching (RIE)) or wet etching is performed using the plating films as a mask to remove the electrode film which has been exposed as a result of the removal of the resist layer.

Thus, electrode films and plating films are stacked to form internal electrode terminals 21a, 23a, 25a, and 27a, a lead wire 29, and a coil conductor 33. Through the above-described steps, a coil conductor layer 83 constituted by the internal electrode terminals 21a, 23a, 25a, and 27a, the lead wire 29, and the coil conductor 33 is formed. For example, the coil conductor layer 83 is formed with a thickness in the range from 18 to 20 μm. A bridge conductor layer 84 and a coil conductor layer 85, which will be described layer, are formed in the same manner as the coil conductor 83.

Next, polyimide resin is applied throughput the resultant surface to form an insulation film 7b having a thickness in the range from 7 to 8 μm. The insulation film 7b is then exposed, developed, and patterned. As a result, the insulation film 7b is formed with a through hole 31a at which an inner circumferential end of the coil conductor 33 is exposed, a through hole 31b at which one end of the lead wire 29 is exposed, and openings at which the electrode terminals 21a, 23a, 25a, and 27a are exposed. The insulation film 7b is then cured.

Next, a metal layer such as a Cu layer (not shown) is formed throughout the resultant surface using a vacuum film forming process (such as evaporation or sputtering) or a plating process. Next, a resist is applied throughout the resultant surface to form a resist layer, and a pre-baking process is performed on the resist layer as occasion demands. Exposure is then carried out on the resist layer by irradiating the resist layer with exposure light through a mask having patterns drawn thereon representing internal electrode terminals 21b, 23b, 25b, and 27b and bridge conductors 73 and 75. After performing a heating process as occasion demands, the resist layer is developed using an alkaline developer. Then, a cleaning step similar to that involved in the step of forming the coil conductor layer 83 is performed. As a result, the resist layer is patterned in a predetermined shape to form a resist frame.

Next, the magnetic substrate 3 is immersed in a plating liquid in a plating bath to perform a plating process using the resist frame as a die, and plating films of Cu are thereby formed in gaps of the resist frame. The magnetic substrate 3 is then washed and dried as occasion demands, and the resist frame is removed from the insulation film 7b using an organic solvent. Then, dry etching (such as ion milling or reactive ion etching (RIE)) or wet etching is performed using the plating films as a mask to remove the electrode film which has been exposed as a result of the removal of the resist layer.

Thus, electrode films and plating films are stacked to form internal electrode terminals 21b, 23b, 25b, and 27b and bridge conductors 73 and 75. The internal electrode terminals 21b, 23b, 25b, and 27b are formed on the electrode terminals 21a, 23a, 25a, and 27a, respectively. One end of the bridge conductor 73 is connected to one end of the lead wire 29 through the through hole 31b, and another end of the conductor is connected to the inner circumferential end of the coil conductor 33 through the through hole 31a. Through the above-described steps, a bridge conductor layer 84 constituted by the internal electrode terminals 21b, 23b, 25b, and 27b and the bridge conductors 73 and 75 is formed. For example, the bridge conductor layer 84 is formed with a thickness in the range from 7 to 8 μm.

Next, polyimide resin is applied throughput the resultant surface to form an insulation film 7c having a thickness in the range from 7 to 8 μm. The insulation film 7c is then exposed, developed, and patterned. As a result, the insulation film 7c is formed with through holes 37a and 37b at which both ends of the bridge conductor 75 are exposed and openings at which the electrode terminals 21b, 23b, 25b, and 27b are exposed. The insulation film 7c is then cured.

Next, a metal layer such as a Cu layer (not shown) is formed throughout the resultant surface using a vacuum film forming process (such as evaporation or sputtering) or a plating process. Next, a resist is applied throughout the resultant surface to form a resist layer, and a pre-baking process is performed on the resist layer as occasion demands. Exposure is then carried out on the resist layer by irradiating the resist layer with exposure light through a mask having patterns drawn thereon representing internal electrode terminals 21c, 23c, 25c, and 27c, a lead wire 39, and a coil conductor 35. After performing a heating process as occasion demands, the resist layer is developed using an alkaline developer. Then, a cleaning step similar to that involved in the step of forming the coil conductor layer 83 is performed. As a result, the resist layer is patterned in a predetermined shape to form a resist frame.

Next, the magnetic substrate 3 is immersed in a plating liquid in a plating bath to perform a plating process using the resist frame as a die, and plating films of Cu are thereby formed in gaps of the resist frame. The magnetic substrate 3 is then washed and dried as occasion demands, and the resist frame is removed from the insulation film 7c using an organic solvent. Then, dry etching (such as ion milling or reactive ion etching (RIE)) or wet etching is performed using the plating films as a mask to remove the electrode film which has been exposed as a result of the removal of the resist layer.

Thus, electrode films and plating films are stacked to form internal electrode terminals 21c, 23c, 25c, and 27c, a lead wire 39, and a coil conductor 35. The internal electrode terminals 21c, 23c, 25c, and 27c are formed on the internal electrode terminals 21b, 23b, 25b, and 27b, respectively. One end of the lead wire 39 is connected to one end of the bridge conductor 75 through the through hole 37b. An inner circumferential end of the coil conductor 35 is connected to the other end of the bridge conductor 75 through the through hole 37a. Through the above-described steps, a coil conductor layer 85 constituted by the internal electrode terminals 21c, 23c, 25c, and 27c, the lead wire 39, and the coil conductor 35 is formed. For example, the coil conductor layer 85 is formed with a thickness in the range from 18 to 20 μm. Internal electrode terminals 21, 23, 25, and 27 are also formed through the above-described steps.

Next, polyimide resin is applied throughput the resultant surface to form an insulation film 7d having a thickness in the range from 7 to 8 μm. The insulation film 7d is then cured. An adhesive is then applied on the insulation film 7d to form a bonding layer 11. A magnetic substrate 5 is then secured on the bonding layer 11.

The wafer is then cut and separated into individual common mode filters 1 in the form of chips. As a result, the internal electrode terminals 21, 23, 25, and 27 are exposed on cut surfaces of a common mode filter 1. The common mode filter 1 is then polished to chamfer corners thereof.

Although not shown, backing metal films having the same shape as that of external electrodes 13, 15, 17, and 19 are formed on the internal electrode terminals 21, 23, 25, and 27 of the common mode filter 1. The backing metal films are provided by forming a combination of a chromium (Cr) film and a Cu film or a combination of a titanium (Ti) film and a Cu film continuously using a masked sputtering process.

Next, external electrodes 13, 15, 17, and 19 having a double-layer structure made of nickel (Ni) and tin (Sn) on the surface of the backing metal film using electroplating are formed and the common mode filter 1 shown in FIG. 1 is provided.

As described above, in the present embodiment, the bridge conductor layer 84 formed with the bridge conductors 73 and 75 for connecting the inner circumferential ends of the coil conductors 33 and 35 and the internal electrode terminals 21 and 23 is formed between the coil conductor layer 83 and the coil conductor layer 85. Thus, three layers, i.e., the insulation film 7b, the bridge conductor layer 84, and the insulation film 7c are formed between the coil conductor layer 83 and the coil conductor layer 85. Therefore, when compared to a common mode filter in which only an insulation film is formed between coil conductor layers 83 and 85, the distance between the coil conductor layers 83 and 85 of the common mode filter 1 can be easily made longer (e.g., 20 μm or more) without any increase in the number of manufacturing steps which can occur when the insulation film is formed by a plurality of consecutive steps and without a need for switching forming apparatus to form the insulation film between the coil conductor layers 83 and 85 from a material different from the material of other insulation films. The present embodiment therefore makes it possible to manufacture a common mode filter 1 in which coil conductor layers 83 and 85 are spaced at a greater distance at a low cost. Thus, a low-cost common mode filer 1 can be provided.

The method of manufacturing a common mode filter 1 according to the present embodiment allows the number of steps for forming the conductive layers and the number of steps for forming the insulation films to be reduced by one each when compared to the common mode filter disclosed in Patent document 2. Therefore, the common mode filter 1 can be manufactured at a lower cost when compared to the common mode filter disclosed in Patent Document 2.

The common mode filter 1 of the present embodiment is more advantageous, the greater the distance between the coil conductor layers 83 and 85. Thus, the common mode filter 1 can be manufactured with a greater cost reduction, for example, when compared to a thin-film common mode filter as disclosed in Patent Document 2 which satisfies the relationship that "the distance between the two coil conductors>the distance between the lead conductor and the coil conductor×2+the thickness of the thinner of the two lead conductors", The invention is not limited to the above-described embodiment and may be modified in various ways.

Although a common mode filter 1 having a pair of coil conductors 33 and 35 disposed opposite to each other has been explained by way of example in the above description of the embodiment, the invention is not limited to such a configuration. For example, the invention may be applied to a common mode filer array having two pairs of coil conductors in which each of coil conductors 33 and 35 is accompanied by one coil conductor provided side by side. Further, one or more additional coil conductors may be provided between the two pairs of coil conductors arranged side by side. Such common mode filter arrays provide the same advantages as those of the above-described embodiment.

What is claimed is:

1. A coil component comprising:

a first coil conductor layer having first and second electrode terminals, a first lead-out conductor one end of which is connected to the first electrode terminal, and a first coil conductor connected to the second electrode terminal at an outer circumferential end thereof;

a second coil conductor layer having third and fourth electrode terminals, a second lead-out conductor one end of which is connected to the third electrode terminal, and a second coil conductor connected to the fourth electrode terminal at an outer circumferential end thereof, the second coil conductor layer being disposed opposite to the first coil conductor layer; and a bridge conductor layer having a first bridge conductor one end of which is connected to another end of the first lead-out conductor and another end of which is connected to an inner circumferential end of the first coil conductor and a second bridge conductor one end of which is connected to another end of the second lead-out conductor and another end of which is connected to an inner circumferential end of the second coil conductor, the bridge conductor layer being formed between the first and second coil conductor layers with insulation films disposed between the bridge conductor layer and the first and second coil conductor layers.

2. A coil component according to claim 1, wherein a thickness of the first and second lead-out conductors is greater than a thickness of the first and second bridge conductors.

3. A coil component according to claim 1, wherein the first and second bridge conductors are not exposed on side surfaces of the insulation films.

* * * * *